United States Patent [19]
Tsuda et al.

[11] Patent Number: 6,166,888
[45] Date of Patent: Dec. 26, 2000

[54] LOW NOISE FLEXIBLE PRINTED CIRCUIT CABLE FOR A DISK DRIVE CARRIAGE UNIT

[75] Inventors: Shingo Tsuda; Goeke Dale, both of Yokohama; Koichi Takeuchi, Yamato; Masaki Kobayashi, Fujisawa, all of Japan

[73] Assignee: International Business Machines Corporation, Armonk, N.Y.

[21] Appl. No.: 09/030,635

[22] Filed: Feb. 25, 1998

[30] Foreign Application Priority Data

Feb. 28, 1997 [JP] Japan ................................. 9-045327

[51] Int. Cl.[7] .................................................. G11B 5/55
[52] U.S. Cl. ............................................... 360/264.2
[58] Field of Search ......................... 360/106, 97.01

[56] References Cited

U.S. PATENT DOCUMENTS 5,953,183  9/1999  Butler et al. ............................ 360/106

Primary Examiner—George J. Letscher
Attorney, Agent, or Firm—Noreen A. Krall; Randall J. Bluestone

[57] ABSTRACT

An FPC cable which is excellent in noise resisting property, manufacturing cost, mounting operability to a carriage, and maintenance. The FPC cable includes a spacer and a reinforcing plate. In the patterned surface of the FPC, a head pad to which a head wire is bonded is formed on a pad forming portion and a preamplifier chip is mounted on a device mounting portion. Wiring patterns are linearly connected between the head pad and the preamplifier chip and between the preamplifier chip and an I/O-side end portion, respectively. In the spacer, a cavity is formed for storing the preamplifier chip. The reinforcing plate is inserted into the space formed by folding back the pad forming portion, and the spacer is engaged with the device mounting device, thereby constituting a magnetic-head-side end portion.

13 Claims, 9 Drawing Sheets

LOW NOISE FLEXIBLE PRINTED CIRCUIT CABLE FOR A DISK DRIVE CARRIAGE UNIT

BACKGROUND OF THE INVENTION

1. Field of the invention

The present invention relates to a disk drive, and particularly, in a magnetic-disk drive, a carriage unit constituting the actuator of the magnetic-disk drive, and a flexible printed circuit (FPC) cable attached to the carriage unit. More particularly, the invention relates to an FPC cable that is provided on its head-side end portion with a pad forming portion on which head pads are formed and a device mounting portion on which electronic devices are mounted which is excellent in noise resisting property, manufacturing cost, electronic device protection property, mounting operability to a carriage, and maintenance.

2. Description of Related Art

An actuator that is provided in magnetic-disk drives has a carriage unit and a voice coil motor (VCM). The carriage unit has a magnetic head mounted thereon and is rotatable over a desired track on the surface of a magnetic disk, and the VCM drives this carriage unit to rotate. The head-side end portion of an FPC cable for data transmission is attached to a carriage constituting the carriage unit, and the head wires from the magnetic head are bonded to the head pad formed on the head-side end portion of the FPC cable. The input/output-side (I/O-side) end portion of the FPC cable is connected to an interface board provided on the bottom surface of the housing of a magnetic-disk drive.

Magnetic-disk drives are becoming higher in density every year. In magnetic-disk drives having four or five 2.5-in or 3.5-in magnetic disks mounted thereon, even noise components due to inductances of head wires and FPC cables become problematic. In order to realize low noise, there is a need to get the mounting position of a preamplifier chip, which amplifies the data read out from a magnetic head, closer to a magnetic head, that is, there is a need to mount the preamplifier chip on the head-side end portion of the FPC cable.

However, if a preamplifier chip is mounted on the head-side end portion of an FPC cable, the pad forming portion for forming head pads will become narrower and therefore the head pad and the spacing between head pads will become smaller. Consequently, it will become difficult to connect head wires to head pads by soldering. In addition, if a supersonic bonding method is employed to bond head wires to head pads, the manufacturing cost will be increased. Furthermore, the wiring of head wires becomes complicated, also a wire from a certain head and a wire from another head need to cross each other, and an angle at which a head wire is pulled out of a wire tube must be made larger. As a consequence, head wire durability becomes worse, bonding operation becomes complicated, and maintenance is reduced. Particularly, in the case where a magnetic head equipped with a magnetoresistive (MR) sensor for reading out data and a thin-film device for recording data is employed, four head wires extend from a single magnetic head and therefore the number of head pads is increased and also the preamplifier chip is increased in size, so that the aforementioned problems become conspicuous.

Also, although there are cases where a preamplifier chip is mounted on the rear surface of a pad forming portion by employing a double-sided FPC or a ceramic substrate, in either case the manufacturing cost will become higher. In addition, since electronic devices, such as preamplifiers, are attached to a rotatable carriage, the protection of these electronic devices must also be taken into consideration. Accordingly, there is a need to provide an FPC cable to address the problems and limitations encountered in the prior art devices.

SUMMARY OF THE INVENTION

The present invention has been made in order to solve conventional problems found in the prior art, and an object of the invention is to provide an FPC cable which is excellent in noise resisting property, manufacturing cost, protection property of mounted electronic devices, mounting operability to a carriage, and maintenance. Another object of the invention is to provide a carriage unit which is excellent in manufacturing cost, head wire durability, mounting operability around head wires, and maintenance. Still another object of the invention is to provide a magnetic-disk drive which reconciles low cost and low noise in data transmission and also is excellent in the maintenance of the carriage unit.

In a flexible printed circuit (FPC) cable of the present invention for achieving the aforementioned objects, a pad forming portion is provided on one end portion of a patterned surface of the FPC cable. Also, a device mounting portion which has an electronic device mounted thereon is provided on a portion of the patterned surface adjacent to the pad forming portion. In addition, the head-side end portion of the FPC cable is formed by folding back the pad forming portion so that a rear surface of the patterned surface is located inside. With this arrangement, an enhancement in noise resisting property, low cost, and enhancements in the mounting operability to the carriage and maintenance are achieved.

In an FPC cable according to the present invention, the pad forming portion and the device mounting portion are provided on one end portion of the FPC cable. Also, the FPC cable is equipped with a spacer which is formed with a cavity for storing an electronic device. In addition, the head-side end portion of the FPC cable is constituted by engaging the spacer with a main body of the FPC cable so that the electronic device is stored in the cavity and that the device protecting surface adheres closely to the device mounting portion. With this arrangement, an enhancement in the protection property of the electronic device is achieved.

In a carriage unit according to the present invention, the head-side end portion of the FPC cable of the present invention is attached to a carriage and a head wire is connected to the pad forming portion of the FPC cable, thereby achieving low cost, enhancements in the mounting operability around head wires and maintenance.

Furthermore, in another carriage unit of the present invention, wire tubes cover the head wires extending to the pad forming portion of the FPC cable in non-parallel to each other, thereby achieving low cost, enhancements in the mounting operability around head wires and maintenance.

Moreover, a disk drive of the present invention constitutes the actuator by employing the aforementioned carriage unit, thereby achieving compability of low cost and low transmitted-data noise and also an enhancement in the maintenance of the carriage unit.

DETAILED DESCRIPTION OF THE PREFERRED EMBODIMENT

Figure 1:
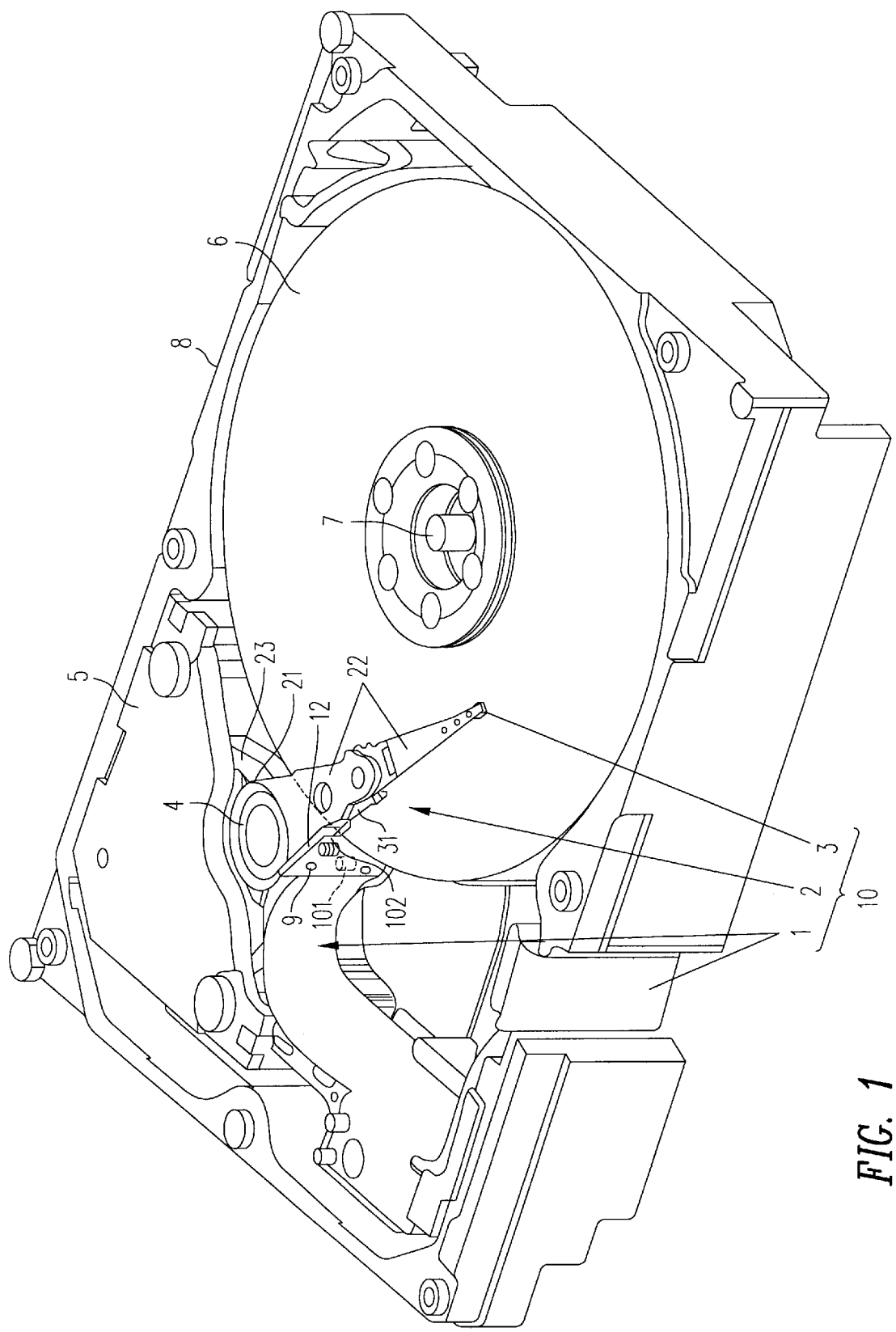
FIG. 1 is a perspective view showing a magnetic-disk drive according to the present invention.

FIG. 1 is a perspective view showing a magnetic-disk drive according to the present invention. The magnetic-disk drive shown in FIG. 1 houses into a housing 8 a magnetic disk 6 which is a data storage medium, a spindle motor 7 for driving the magnetic disk 6 to rotate, and an actuator for moving a magnetic head 3 to a desired access position on the surface of the magnetic disk 6. This actuator has a carriage unit 10 fitted on a stationary shaft 4 (an axis of rotation) so as to be free to rotate and a voice coil motor (VCM) provided interiorly of a yoke 5 for rotating the carriage unit 10 on the stationary shaft 4. The stationary shaft 4 is fixed to the bottom of the housing 8, and the VCM has a voice coil and a magnetic circuit. The magnetic head 3 is taken to be a magnetic head provided with an MR head for writing data and a thin-film head for recording data. Four head wires extend from the magnetic head 3. Also, the magnetic-disk drive shown in FIG. 1 may be taken to have a plurality of magnetic disks 6 mounted therein.

Figure 2:
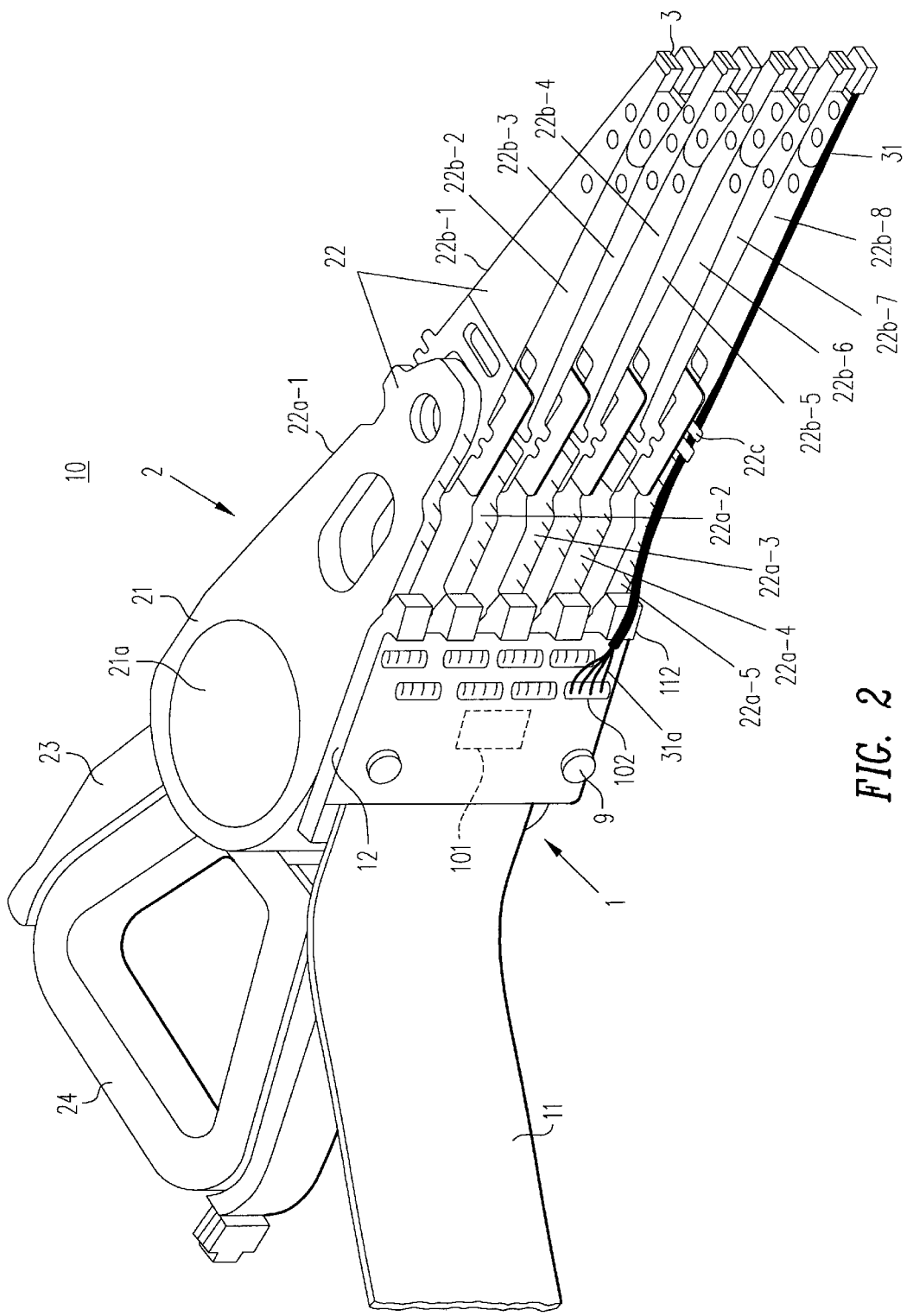
FIG. 2 is a perspective view showing the carriage unit of the present invention.

FIG. 2 is a perspective view showing the carriage unit 10 according to the present invention. In FIGS. 1 and 2 the carriage unit 10 has an FPC cable 1, a carriage 2, and magnetic heads 3. The upper surface and the bottom surface of the carriage 2 form a taper configuration. The wider end portion in this taper configuration includes rotational bearing 21, and a portion from the rotational bearing 21 to the narrower end portion in the taper configuration includes head arm 22. In the rotational bearing 21 a hollow portion 21a is formed. A plurality of head arms 22 are protruded in the form of a comb. Also, voice coil arms 23 protrude from the carriage 2, and the voice coil 24 of the VCM is attached to the voice coil arms 23.

The head arm 22 comprises a carriage arm 22a provided integrally with the rotational bearing 21 and a spring arm 22b hung on the front end of the carriage arm 22a. On the front end of the spring arm 22b the magnetic head 3 is mounted. The uppermost and lowermost carriage arms 22a-1 and 22a-5 each have a single spring arm hung thereon, and the intervening carriage arms 22a-2, 22a-3, and 22a-4 each have two spring arms hung thereon. The spring arms 22b-1, 22b-3, 22b-5, and 22b-7 are used for the upper surfaces of the magnetic disks 6, respectively. Also, the spring arms 22b-2, 22b-4, 22b-6, and 22b-8 are used for the lower surfaces of the magnetic disks 6, respectively. In addition, the magnetic head 3 records data on the magnetic disk 6 and reads out this recorded data from the magnetic disk 6. This magnetic head 3 is connected to a head wire covered with a wire tube 31. The wire tube 31 is, for example, a "Teflon" tube. Note in FIG. 2 that only the wire tube 31 of the magnetic head 3, attached to the spring arm 22b-8, is shown and the wire tubes 31 of the magnetic heads 3 other than this are omitted.

Figure 3:
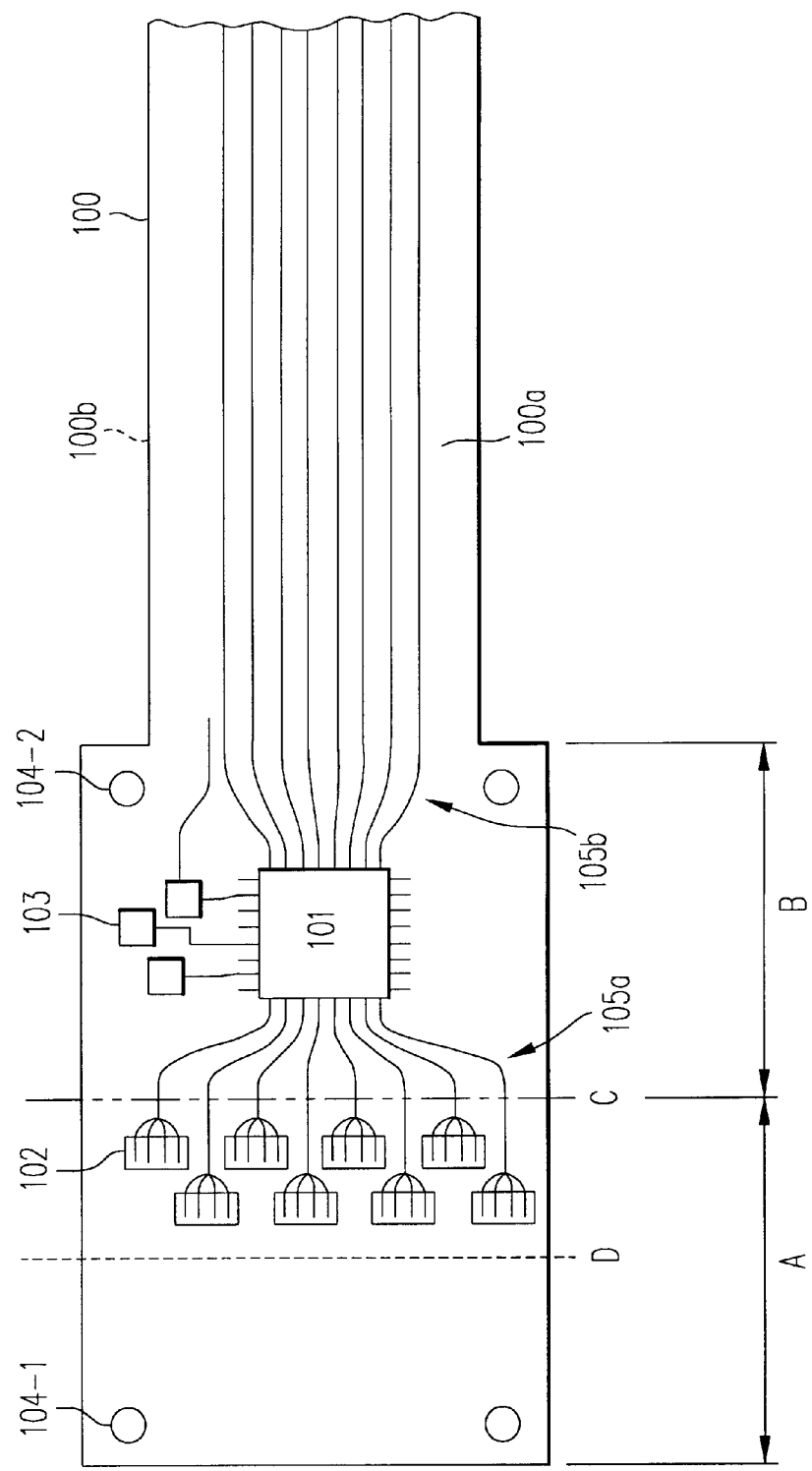
FIG. 3 is a plan view showing the structure of the FPC in accordance with the present invention.
Figure 4A:
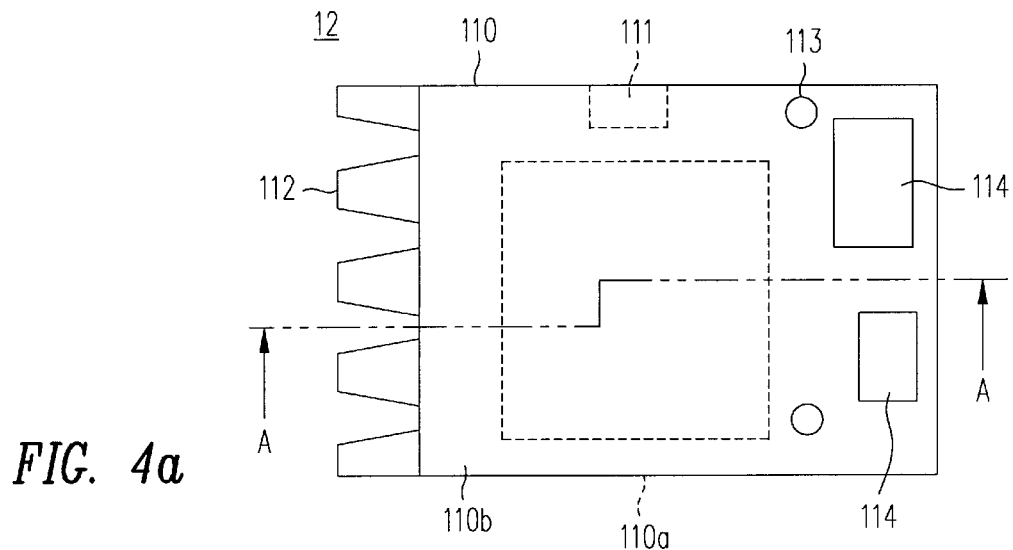
FIGS. 4(a)–4(c) show the structure of the spacer according to the present invention.
Figure 4B:
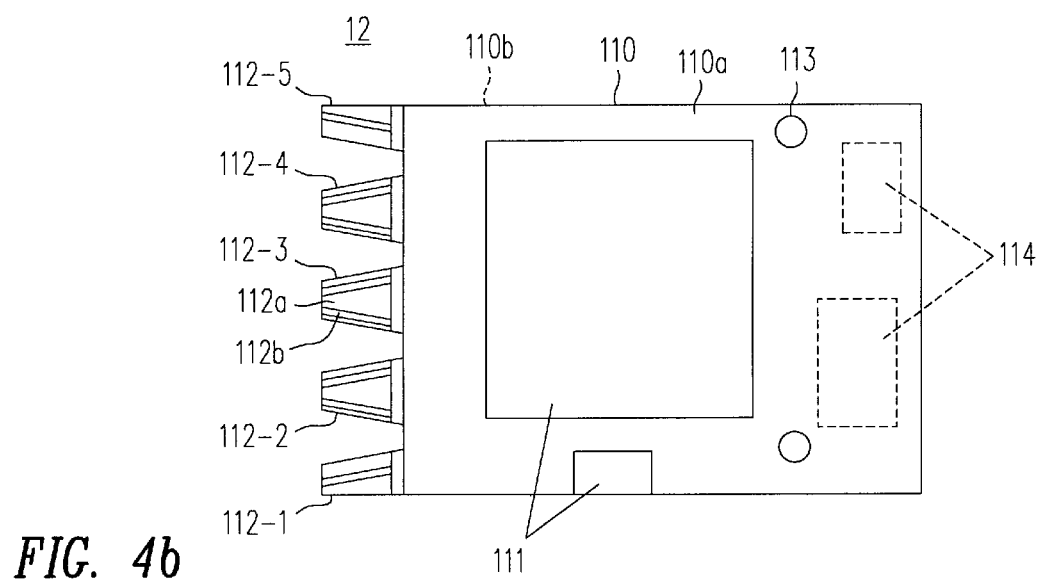
Figure 4C:
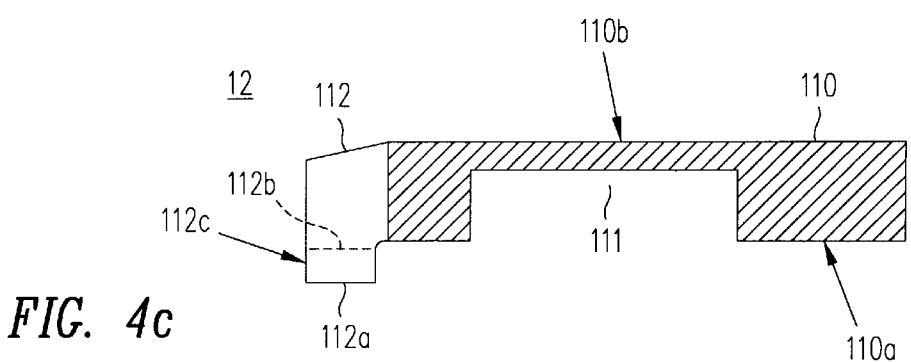

The FPC cable 1 is a cable for transferring the data read out of the magnetic disk 6 to an interface board (not shown). The lower side of the interface board (not shown) is provided on the bottom surface of the housing 8 of FIG. 1. The FPC cable 1 is also used to transfer the data from the interface to the magnetic head 3. The FPC cable 1 has an FPC 11 (the details of which is shown in FIG. 3) and a spacer 12 (the details of which is shown in FIGS. 4(a)–4(c)). The head-side end portion of the FPC 11 is attached to the side surface of the carriage 2 between the spacer 12 and the carriage 2 by screws 9, and the I/O-side end portion (not shown) of the FPC 11 is connected to the interface board. The head-side end portion of the FPC 11 is folded back as described later. On the surface of the head-side end portion of the FPC 11 facing the spacer 12, electronic devices including a preamplifier chip 101 for amplifying transmitted data are mounted, and these electronic devices are stored in a cavity 111 formed in the spacer 12. Also, on the other surface of the head-side end portion away from the spacer 12, head pads 102 are formed. The side of the head-side end portion of the FPC 11 on which the electronic devices are mounted is referred to as the device mounting portion, and the side on which the head pads are formed is referred to as the pad forming portion. In the FPC cable 1, a portion which is curved with rotation of the carriage 2 is referred to as a curving portion, and a portion fixed to the housing 8 is referred to as a fixed portion. The end portion on the curving portion side of the FPC cable 1 is the head-side end portion, and the end portion on the fixed portion side is the I/O-side end portion.

The wire tube 31 is clamped by the edge portion of the spring arm 22b on the side on which the FPC cable 1 is mounted, and the wire tube 31 is guided from the magnetic head 3 to the spacer 12. Furthermore, the wire tube 31 is clamped by a clamp groove 112b formed in the corresponding one of the brackets 112 protruded in the form of a comb from the end face of the spacer 12 on the side of the magnetic head 3. A head wire 31a extending from the wire tube 31 clamped by the clamp groove 112b is bonded to the head pad 102.

FIG. 3 is a plan view showing the structure of the FPC 11. The FPC 11 consists of tape-shaped flexible resin 100. The surface of this flexible resin 100 shown in FIG. 3 is taken to be a patterned surface 100a, and the rear surface taken to be a resin surface 100b. The end portion on the side of the flexible resin 100 shown in FIG. 3 becomes the head-side end portion, and the other end portion (not shown) becomes the I/O-side end portion. The head-side end portion of the patterned surface 100a is provided with a pad forming portion A and a device mounting portion B adjacent to the end of the this pad forming portion A on the side of the I/O-side end portion. The pad forming portion A is formed with the head pads 102 for bonding head wires. On the device mounting portion B adjacent to the pad forming portion A, electronic devices, typically the preamplifier chip 101 and also circuit devices 103, such as resistors and capacitors, are mounted. In addition, the patterned surface 100a is formed with a wiring pattern 105a which connects the head pads 102 with electronic devices such as preamplifier chip 101 and a wiring pattern 105b which leads from the electronic devices through the curving portion and the fixed portion to the I/O-side end portion. Furthermore, the pad forming portion A and the device mounting portion B are formed with screw holes 104-1 and 104-2, respectively. The screw holes 104-1 and 104-2 are respectively formed at the positions at which they superimpose each other when the pad forming portion A is folded back to the side of the resin surface 100b at the boundary C between the pad forming portion A and the device mounting portion B. The FPC 11 shown in FIG. 3 is one where lands for mounting the head pads 102 or the electronic devices are formed only on a single side, that is, the patterned surface 100a, and is called a single-sided FPC. The single-sided FPC can be manufactured at a low cost. The preamplifier chip 101 comprises, for example, an IC package such as QFP and an IC lead is mounted on the lands formed on the device mounting portion B by soldering. Note that a leadless IC package may also be employed as the preamplifier chip 101. In such a case, after the pads formed on the chip and the lands formed on the device mounting portion B have been bonded together with bonding wires, the preamplifier chip 101 is covered on the surface with seal resin and fast attached to the patterned surface 100a. Also, the D in FIG. 3 may be used as the end of the flexible resin 100 and the pad forming portion A as the C to D in FIG. 3. Furthermore, the screw holes 104-1 need not be formed in the pad forming portion A.

In the FPC 11, since the device mounting portion B is interposed between the pad forming portion A formed with the head pads 102 and the I/O-side portion, the wiring patterns 105a and 105b can be linearly formed with minimum length, respectively. In addition, because the device mounting portion B is formed adjacent to the pad forming portion A, the wiring pattern 105a for connecting the head pad 102 and the preamplifier chip 101 together can be shortened. Therefore, the wiring length from the head pad 102 to the preamplifier chip 101 and the wiring length from the head pad 102 to the I/O-side end portion can be made shortest, so that a low noise in transmitted data can be achieved. Additionally, since the wiring pattern 105b leading from the device mounting portion B to the I/O-side end portion does not pass through the pad forming portion A, there will be enough room in the pad forming portion A, and consequently, the spacing between the head pads 102 can be widened.

FIGS. 4(a)–4(c) show the structure of the spacer 12. FIG. 4(a) is a plan view of the carriage surface contacting the carriage 2, FIG. 4(b) a plan view of the device protecting surface contacting the device mounting portion B of the FPC 11, and FIG. 4(c) a sectional view taken substantially along line A—A of FIG. 4(a). In FIGS. 4(a)–(c), the spacer 12 has a flat plate portion 110 formed with an insulating material, and in the device protecting surface 110a of this flat plate portion 110, the cavity 111 for storing the preamplifier chip 101 and circuit device 103 is formed. Five brackets 112 with protrusions 112c protruding to the device protecting surface 110a of the flat plate portion 110 are protruded in comb form from one end face of the flat plate portion 110. Furthermore, the flat plate portion 110 is provided with male-screw holes 113 and through holes 114 for weight reduction. In the upper surface 112a of the protrusion 112c of the bracket 112 the clamp groove 112b is formed for clamping the wire tube 31. The number of the brackets 112 is the same number as the carriage arms 22a. The flat plate portion 110 and the brackets 112 are integrally formed, for example, from plastic material. Note that the cavity 111 may also be a cavity which penetrates the flat plate portion 110 and leads to the carriage surface 110b or a cavity which reaches the edge of the flat plate portion 110 or a cavity which penetrates the flat plate portion 110 and leads to the carriage surface 110b and also reaches the edge of the flat plate portion 110.

In FIG. 4(b) the opposite brackets 112-1 and 112-5 are each provided with a single clamp groove 112b and the inner brackets 112-2 through 112-4 are each provided with two clamp grooves 112b. The two clamp grooves 112b in each of the inner brackets 112-2 through 112-4 are formed so as to spread out in non-parallel to each other, that is, to both sides from the front end toward the flat plate portion 110. The single clamp groove 112b of the end brackets 112-1 and 112-5 is formed so as to incline inward from the front end toward the flat plate portion 110.

Figure 5A:
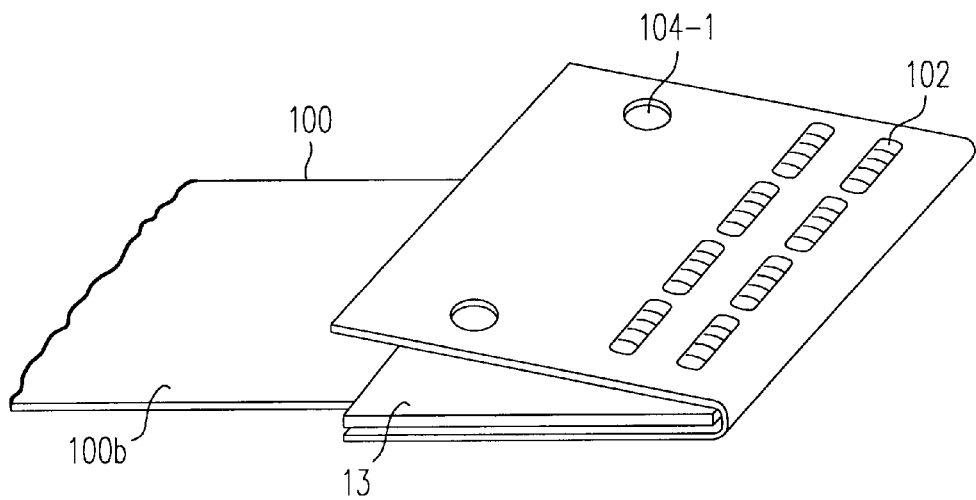
FIGS. 5(a)–5(b) show a procedure for folding back the pad forming portion of an FPC to engage the FPC and a spacer with each other, according to the present invention.
Figure 5B:
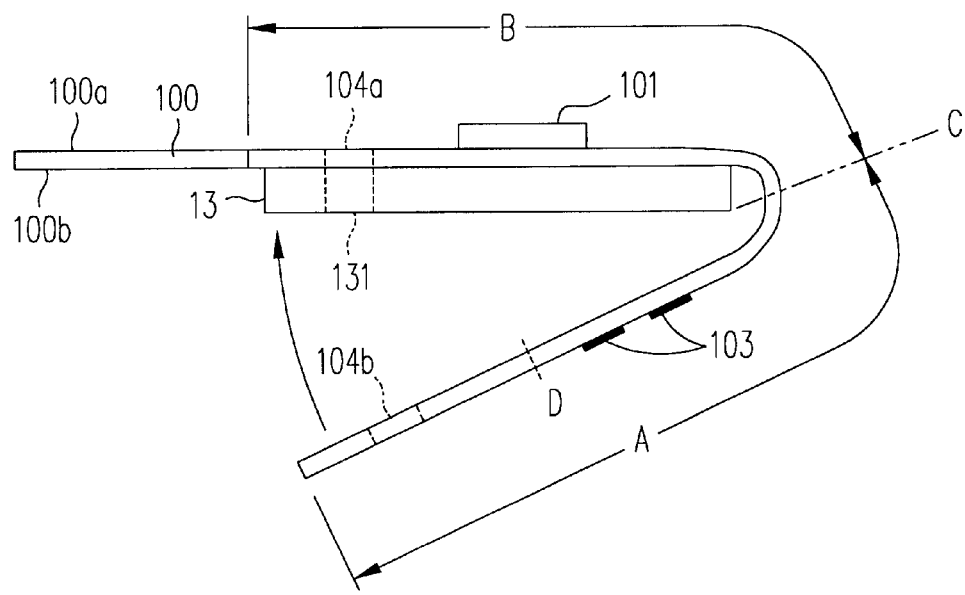
Figure 6A:
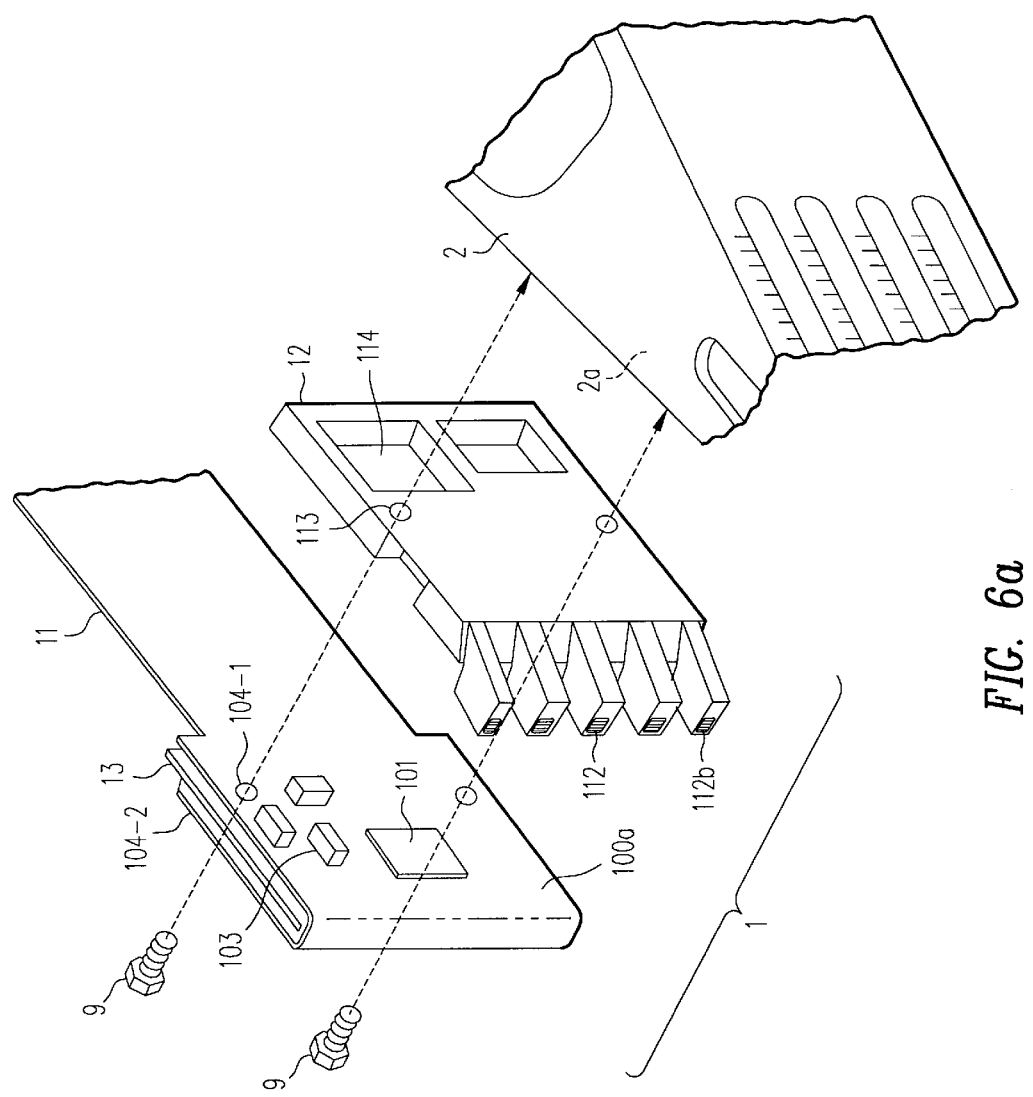
FIGS. 6(a)–6(b) show a procedure of attaching the FPC cable to the carriage according to the present invention.
Figure 6B:
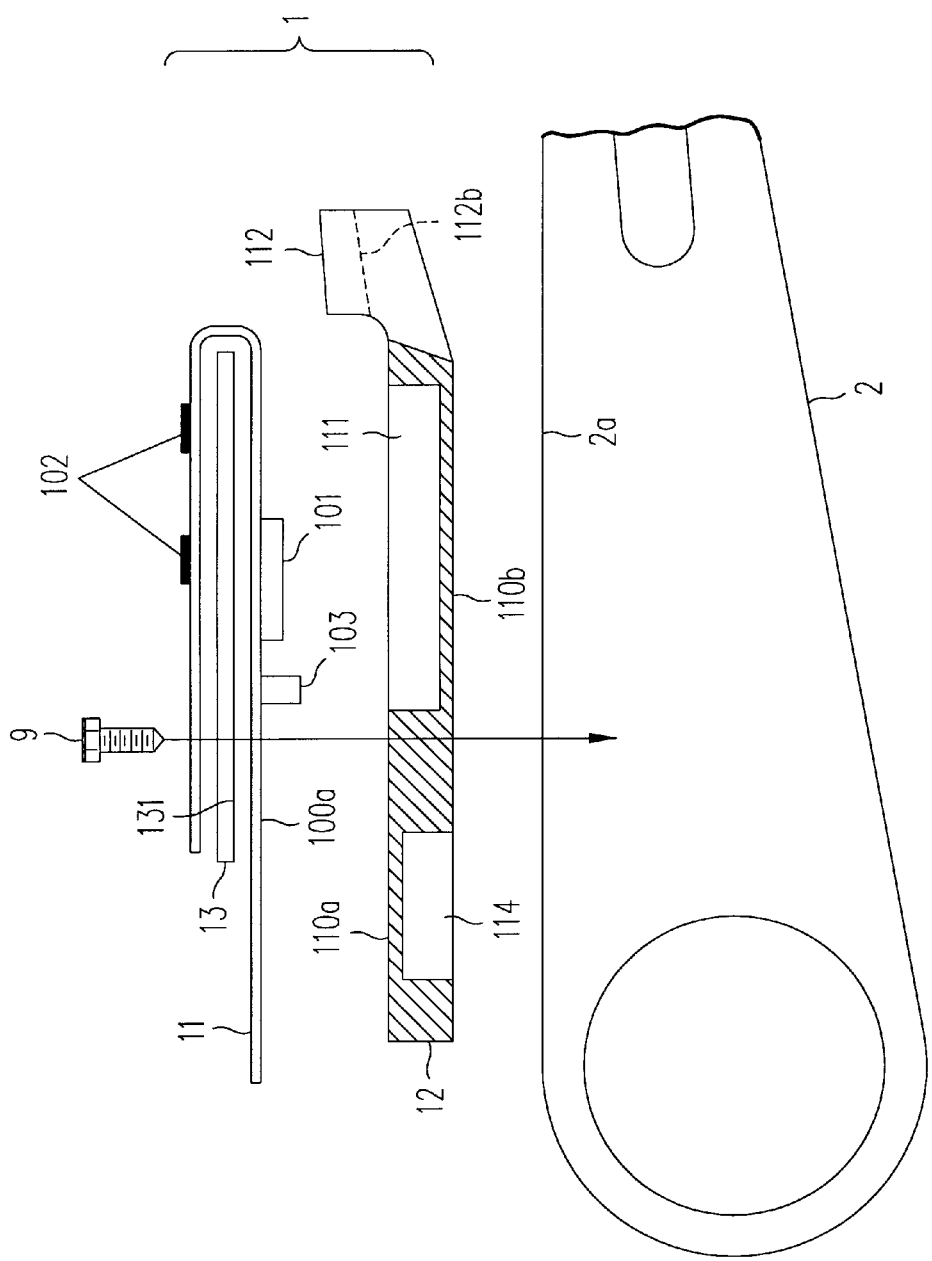
Figure 7A:
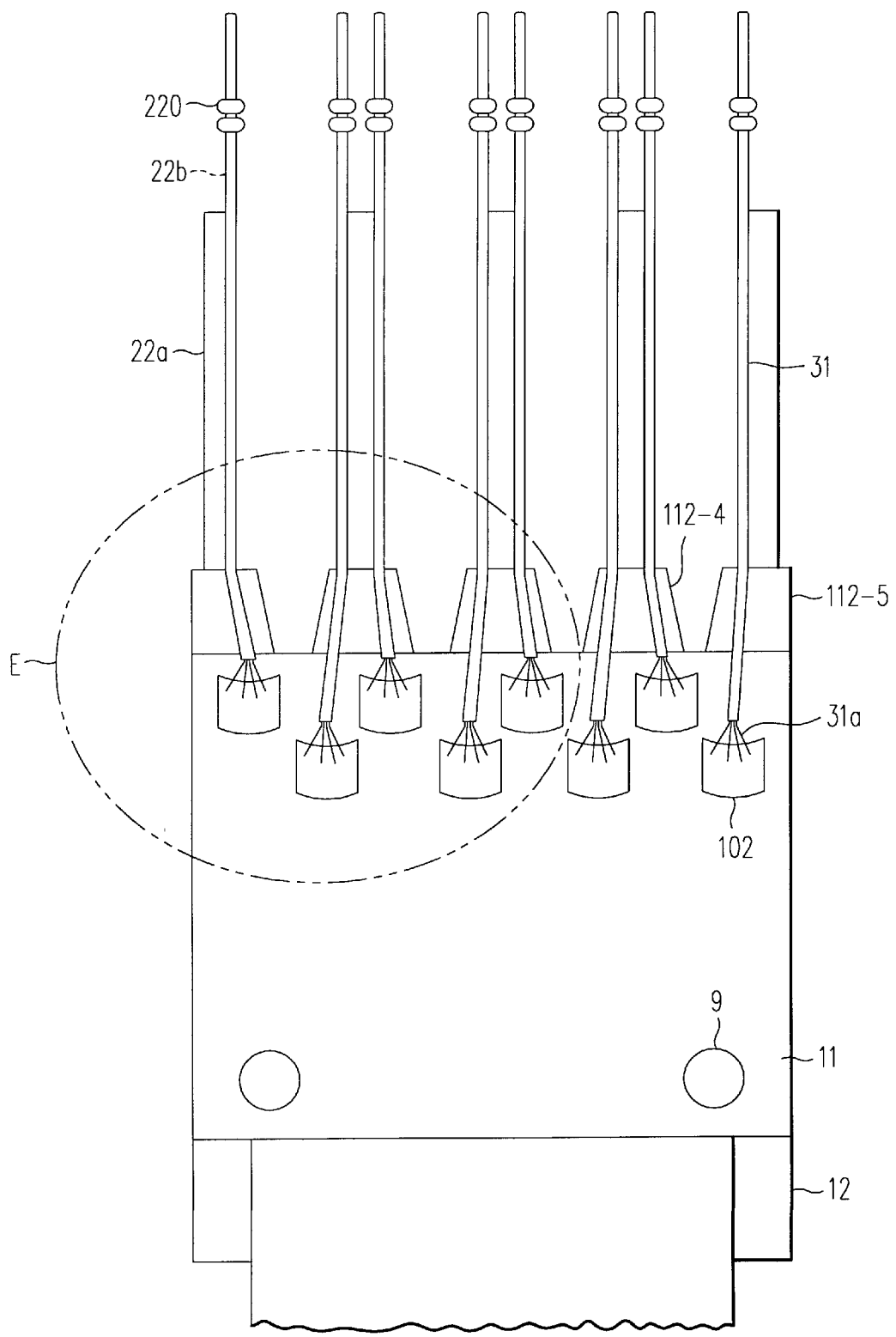
FIGS. 7(a)–7(b) show the connecting portion between head wires and the head pads.
Figure 7B:
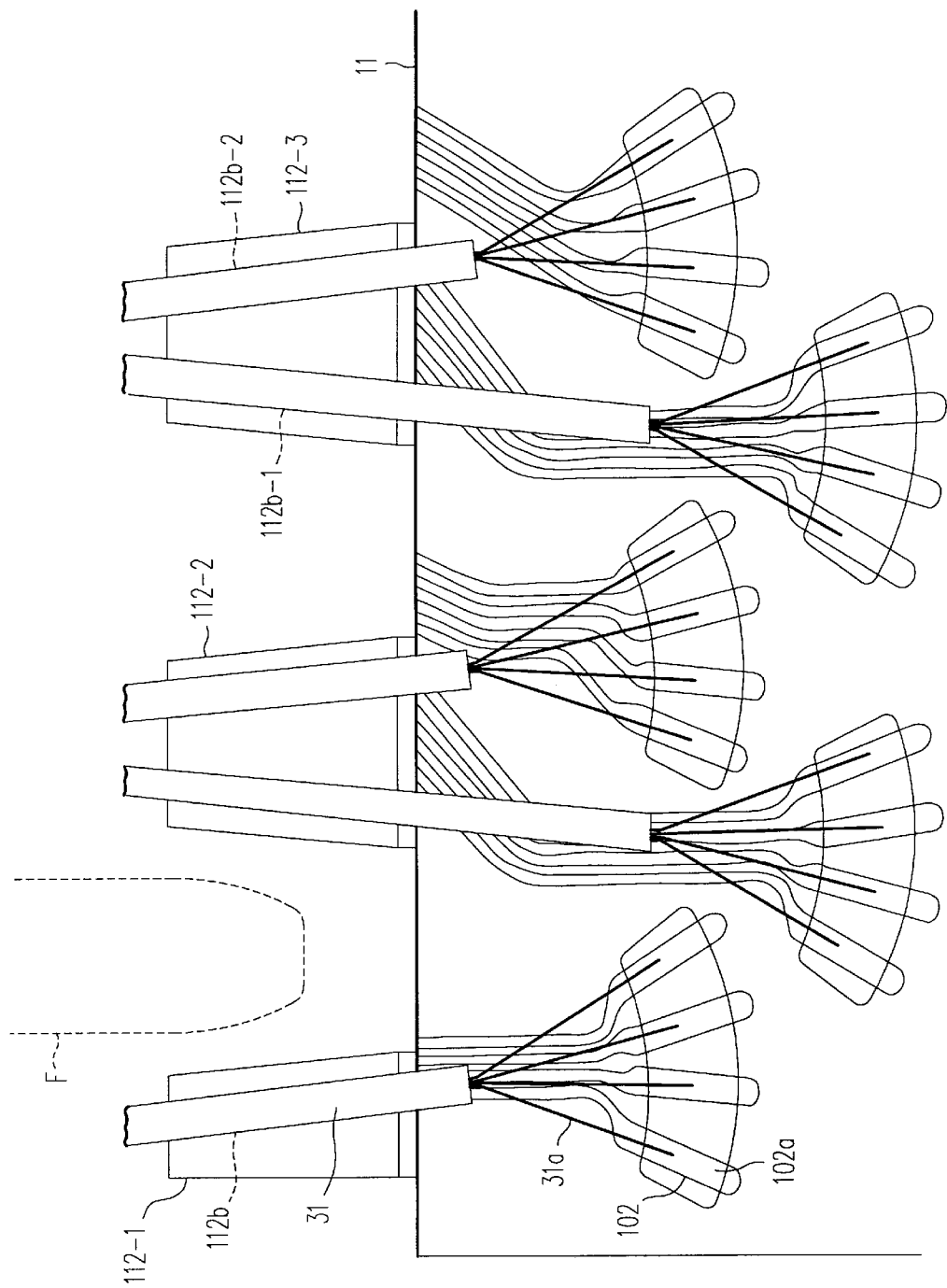

For an example of the procedure for engaging the FPC 11 and the spacer 12 with each other, then attaching the head-side end portion of this FPC cable 1 to the carriage 2, and bonding the head wire 31a to the head pad 102, a description will now be made in reference to FIGS. 5 through 7. FIGS. 5(a)–5(b) are diagrams showing a procedure for folding back the pad forming portion A of the FPC 11. FIG. 5(a) is a perspective view and FIG. 5(b) a side view. FIGS. 6(a)–6(b) are diagrams showing a procedure for engaging the FPC 11 folded back with the spacer 12 and then attaching the FPC 11 and the spacer 12 to the carriage 2. FIG. 6(a) is an exploded perspective view and FIG. 6(b) a top plan view. Also, FIGS. 7(a)–7(b) are diagrams showing a connecting portion between the head wires 31a and the head pads 102. FIG. 7(a) is a plan view of the peripheral portion of the spacer 12 and FIG. 7(b) an enlarged view of a part indicated by a circle E in FIG. 7(a). Note that a dotted line F in FIG. 7(b) represents the position at which the magnetic disk 6 is located when the carriage 2 is assembled into the housing 8.

First, as shown in FIG. 5(b), at the boundary C between the pad forming portion A and the device mounting portion B of the FPC 11, the pad forming portion A is folded back so that the resin surface 100b is located inside, and a reinforcing plate 13 provided with screw holes 131 is interposed between the pad forming portion A and the folded device mounting portion B. This reinforcing plate 13 is used for an enhancement in the flatness of the pad forming portion A and the device mounting portion B and an enhancement in the heat radiation of electronic devices such as preamplifier chip 101, and the reinforcing plate 13 can also be omitted. In addition, at this time, as occasion demands, the resin surfaces 100b of the pad forming portion A and the device forming portion B are bonded to the surfaces of the reinforcing plate 13, respectively. From the foregoing, head pads 102 and electronic devices (such as preamplifier chip 101) will be positioned on opposite surfaces. Note that when the end of the flexible resin 100 is located at D in FIG. 5(b) and the pad forming portion A extends from the boundary C to D, there is a need to bond the pad forming portion A to the reinforcing plate 13 by adhesion.

Next, as shown in FIGS. 6(a) and 6(b), the pad forming portion A and device mounting portion B of the folded FPC 11, the reinforcing plate 13, and the spacer 12 are fixedly attached to the side surface 2a of the carriage 2 through the screw holes 104-1, 104-2 and 113 by means of screws 9. At this time, the carriage surface 110b of the spacer 12 adheres closely to the side surface 2a of the carriage 2. Also, the preamplifier chip 101 and the circuit device 103 are stored in the cavity 111 of the spacer 12, and the patterned surface 100a of the device mounting portion B of the FPC 11 adheres closely to the device protecting surface 110a of the spacer 12. From the foregoing, the head-side end portion of the FPC 11 is attached to the side surface 2a of the carriage 2 with electronic devices, including preamplifier chip 101, positioned on the side of the carriage 2, and the electronic devices are protected by the spacer 12. Note that the spacer 12 may also be engaged with the FPC 11 and fixed to the FPC 11 by adhesion, and then the head-side end portion of the FPC cable 1 comprising the FPC 11, the spacer 12, and the reinforcing plate 13 may also be fixed to the side surface 2a of the carriage 2. In addition, a means of fixing the FPC cable 1 to the carriage 2 is not limited to screw connection.

Next, as shown in FIGS. 7(a) and 7(b), the wire tube 31 from the magnetic head 3 clamped by the damper 22c of the spring arm 22b is guided along the longitudinal edge of the carriage arm 22a and fitted into the clamp groove 112b of the spacer 12. Then, four head wires 31a extending from the wire tube 31 fitted into the clamp groove 112b are bonded to the lands 102a of the head pads 102 by soldering, respectively.

Two wire tubes 31 clamped by each of the inner brackets 112-2 through 112-4 are guided to the pad forming portion A so that the tubes spread out in non-parallel, that is, to both sides. Also, the wire tube 31 clamped by each of the end brackets 112-1 and 112-5 is guided to the pad forming portion A so as to incline inward. Thus, by guiding the wire tubes 31 to the pad forming portion A so that they are in non-parallel to each other, the end portions of the 8 wire tubes 31 can be disposed at nearly equal intervals on the regions of the pad forming portion A on which the head pads 102 are formed. By disposing the end portions of the wire tubes 31 at equal intervals, when the head wire 31a is bonded to the head pad 102, the angle at which the head wire 31a is pulled out of the wire tube 31 can be made smaller, and consequently, the fatigue or breaking of the head wire 31a can be prevented. In addition, since there will be no possibility that a certain wire tube 31 will be superimposed on a head wire 31a extending from another head tube 31, enhancements in the bonding operability of the head wires 31a and the maintenance operability can be achieved. By the described bonding operation of the head wires 31a to the head pads 102, the assembly of the carriage unit 10 shown in FIG. 2 is completed. Note that the means of guiding the wire tubes 31 to the pad forming portion A in non-parallel to each other is not limited to the brackets 112 provided in the spacer 12.

Next, the carriage unit 10 is fitted on the rotational shaft 4 shown in FIG. 1. As shown in FIG. 1, the rotational shaft 4 is fixed to the housing 2, and the spindle motor 7 and the magnetic disks 6 are assembled. Also, in the state where the yoke 5 has not been attached yet, the rotational bearing 21 of the carriage unit 10 is fitted on the rotational shaft 4, and the data I/O-side end portion of the FPC cable 1 is connected to the interface board provided on the bottom surface of the housing 2. At this time, with the head arm 22 held at a position rotated clockwise from the position shown in FIG. 1 so that the head arm 22 does not impinge on the magnetic disk 6, the carriage unit 10 is fitted on the rotational shaft 4 and then the carriage unit 10 is rotated counterclockwise on the rotational shaft 4 to move the head arm 22 over the surface of the magnetic disk 6. Finally, a crash stop (not shown) for prescribing the range of movement of the yoke 5 and the carriage unit 10 is mounted and a top cover is attached to the housing 2 by screws, thereby completing the assembly of the magnetic-disk drive.

Thus, in the FPC cable 1, by forming the head-side end portion by folding back the pad forming portion A, both the wiring pattern 105a between the head pads 102 and the electronic devices including the preamplifier chip 101 and the wiring pattern 105b leading from the electronic devices to the I/O-side end portion can be linearly formed with shortest length, so that noise resisting property can be enhanced. In addition, by mounting electronic devices, such as preamplifier chip 101, on the rear surface of the pad forming portion A and also forming the wiring pattern 105b without passing through the pad forming portion A, the spacing between the head pads 102 can be widened, whereby enhancements in the boding operability of the head wires 31a and the maintenance operability can be achieved.

Furthermore, since a single-sided FPC can be employed as the FPC 11 and also the bonding operation of the head wires 31a can be performed by soldering, the manufacturing cost can be reduced.

Moreover, by having the spacer 12 formed with the cavity 111 for storing electronic devices including the preamplifier chip 101 and also by engaging the spacer 12 with the FPC 11 to constitute the head-side end portion of the FPC 11, the electronic devices mounted on the head-side end portion can easily be protected.

Additionally, by providing the reinforcing plate 13 between the folded pad forming portion A and the device mounting portion B, the flatness in the pad forming portion A and the device mounting portion B can be enhanced and also the heat radiation in electronic devices such as preamplifier chip 101 can be enhanced.

In the carriage unit 10 having the FPC cable 1 mounted thereon, the spacer 12 is provided with the brackets 112 formed with clamp grooves 112b spreading out in non-parallel to each other toward the pad forming portion A, and the wire tubes 31a of the head wires 31 are fitted into the clamp grooves 112b. With this arrangement, the end portions of the wire tubes 31 on the side of the pad forming portion A can be disposed at nearly equal intervals. As a consequence, since the angle at which the head wire 31a connected to the head pad 102 is pulled out of the wire tube 31 can be made smaller and also the fatigue or breaking of the head wire 31a can be prevented, head wire durability can be enhanced. In addition, the connection operability of the head wire 31a to the head pad 102 and the maintenance operability around the head wire can be enhanced. Furthermore, since the connecting operation can be performed by soldering, the manufacturing cost can be reduced.

Also, by attaching the head-side end portion of the FPC cable 1 to the side surface 2a of the carriage 2 with the spacer 12 on the side of the carriage 2, the compactness of the carriage unit can be achieved.

In the magnetic-disk drive of FIG. 1 having the carriage unit 10 incorporated therein, low cost and low noise in data transmission can be reconciled and the maintenance of the carriage unit can be enhanced.

Note that an FPC cable formed only by employing the FPC 11 of FIG. 3 may also be attached to the carriage 2.

Also, the two clamp grooves formed in the bracket 112 of the spacer 12 may be parallel with each other. In addition, without providing the bracket 112 on the spacer 12, a clamper for the wire tube 31 may be provided, for example, in the head arm 22 of the carriage 2. Furthermore, the spacer 12 formed with the cavity 111 may be applied to an FPC where a pad forming portion and a device mounting portion are provided on both sides of the head-side end portion, by employing a double-sided FPC.

Moreover, the means of guiding the wire tubes 31 to the pad forming portion of the FPC cable in non-parallel to each other is not limited to the brackets 112 of the spacer 12. For example, the guiding means may be provided in the head arm 22.

In the FPC cable of the present invention, as described above, both the wire between the head pad and the electronic device and the wire leading from the electronic device to the I/O-side end portion can be linearly formed with shortest length, by forming the head-side portion by folding back the pad forming portion so that the rear of the patterned surface is located inside. Accordingly, there is the advantage that an enhancement in noise resisting property can be achieved. Also, since a single-sided FPC can be employed, there is the advantage that the manufacturing cost can be reduced. In addition, because the wire leading from the electronic device to the I/O-side end portion does not pass through the pad forming portion, the spacing between the head pads can be widened, so that there is the advantage that enhancements in the mounting operability to a carriage and the maintenance can be achieved.

Also, since the spacer formed with a cavity for storing electronic devices is engaged with the main body of the FPC to constitute the head-side end portion of the FPC, there is the advantage that the electronic devices mounted on the head-side end portion can easily be protected.

In addition, in the carriage unit of the present invention, since the spacing between head pads in the pad forming portion of FPC cable can be widened, the connecting operation of the head wire to the head pad requires little time and there is the advantage that enhancements in the mounting operability around head wires and the maintenance can be achieved. Furthermore, as previously mentioned, since the connecting operation can be performed by soldering, there is the advantage that the manufacturing cost can be reduced.

Moreover, the end portions of the wire tubes on the side of the pad forming portion can be disposed at equal intervals by guiding the wire tubes to the pad forming portion of the FPC cable in non-parallel to each other. With this arrangement, the connecting operation of the head wire to the head pad requires little time and there is the advantage that enhancements in the mounting operability around head wires and the maintenance can be achieved. Additionally, since the angle at which the head wire connected to the head pad is pulled out of the wire tube can be made smaller and also the fatigue or breaking of the head wire can be prevented, there is the advantage that head wire durability can be enhanced.

Finally, in the-disk drive of the present invention, low cost and low noise in data transmission can be reconciled, so that there is the advantage that the maintenance of the carriage unit can be enhanced.

We claim:

1. A flexible printed circuit (FPC) cable comprising:
    a pad forming portion on which head pads are formed for connecting head wires of a head;
    a device mounting portion on which an electronic device is mounted; and
    a head-side end portion, including said pad forming portion and said device mounting portion, being attached to a carriage so that data is transferred between said head-side end portion and said head, and said carriage having said head mounted thereon;
    said pad forming portion being provided on one end portion of a patterned surface of said FPC cable and said device mounting portion being provided on a portion of said patterned surface adjacent to said pad forming portion; and
    said head-side end portion being formed by folding back said pad forming portion so that a rear surface of said patterned surface is located inside.

2. The FPC cable as set forth in claim 1, further comprising a spacer having a flat plate portion, a device protecting surface of the flat plate portion being formed with a cavity for storing said electronic device; and
    wherein said head-side end portion is constituted by engaging said spacer with a main body of said FPC cable so that said electronic device is stored in said cavity and that said device protecting surface is in close proximity to said device mounting portion.

3. The FPC cable as set forth in claim 1, wherein a reinforcing plate is provided between said pad forming portion folded back and said device mounting portion.

4. An FPC cable comprising:
    a pad forming portion on which head pads are formed for connecting head wires of a head;
    a device mounting portion on which an electronic device is mounted; and
    a head-side end portion, including said pad forming portion and said device mounting portion, being attached to a carriage so that data is transferred between said head-side end portion and said head, and said carriage having said head mounted thereon;
    said pad forming portion and said device mounting portion being provided on one end portion of said FPC cable;
    said FPC cable being equipped with a spacer having a flat plate portion, a device protecting surface of the flat plate portion being formed with a cavity for storing said electronic device; and
    said head-side end portion being constituted by engaging said spacer with a main body of said FPC cable so that said electronic device is stored in said cavity and that said device protecting surface is in close proximity to said device mounting portion.

5. The FPC cable as set forth in claim 4, wherein said head-side end portion is attached to a side surface of said carriage with said spacer located to the side of said carriage.

6. The FPC cable as set forth in claim 4, wherein:
    said spacer is provided with a plurality of brackets in the form of a comb at one end face of said flat plate portion;
    said brackets have protrusions protruding to the side of said device protecting surface; and
    a clamp groove for a wire tube which covers said head wire is formed in an upper surface of said protrusion of said bracket.

7. The FPC cable as set forth in claim 6, wherein said plurality of brackets include a bracket having a plurality of clamp grooves and further wherein said plurality of clamp grooves are formed so as to extend in non-parallel directions toward said pad forming portion.

8. The FPC cable as set forth in claim 4, wherein said cavity of said spacer spans a depth of said flat plate portion so as to form a hole in said flat plate portion.

9. The FPC cable as set forth in claim 4, wherein said cavity of said spacer spans a depth of said flat plate portion so as to form a hole in said flat plate portion and reaches an edge of said flat plate portion.

10. A carriage unit comprising:
    a carriage having a plurality of head arms protruded in the form of a comb;
    heads mounted on said head arms, one end of each of head wires being connected to each head; and
    an FPC cable where its head-side end portion, including a device mounting portion having an electronic device mounted thereon and a pad forming portion, is attached to said carriage and where the other end of said head wire is connected to said pad forming portion;
    said pad forming portion being provided on one end portion of a patterned surface of said FPC cable and said device mounting portion being provided on a portion of said patterned surface adjacent to said pad forming portion; and
    said head-side end portion being formed by folding back said pad forming portion so that a rear surface of said patterned surface is located inside.

11. A carriage unit comprising:

a carriage having a plurality of head arms protruded in the form of a comb;

heads mounted on said head arms, one end of each of head wires being connected to each head; and an FPC cable where its head-side end portion, including a device mounting portion having an electronic device mounted thereon and a pad forming portion, is attached to said carriage and where the other end of said head wire is connected to said pad forming portion;

said pad forming portion and said device mounting portion being provided on one end portion of said FPC cable;

said FPC cable being equipped with a spacer having a flat plate portion, a device protecting surface of the flat plate portion being formed with a cavity for storing said electronic device; and said head-side end portion being constituted by engaging said spacer with a main body of said FPC cable so that said electronic device is stored in said cavity and that said device protecting surface is in close proximity to said device mounting portion.

12. A disk drive comprising:

a disk which is a data storage medium;

a carriage unit fitted on a rotational shaft so as to be freely rotatable, the rotational shaft being fixedly arranged and said carriage unit being movable along a surface of said disk; and a motor for driving said carriage unit;

wherein said carriage unit comprises:

a carriage having a plurality of head arms protruded in the form of a comb;

heads mounted on said head arms, one end of each of head wires being connected to each head; and an FPC cable where its head-side end portion, including a device mounting portion having an electronic device mounted thereon and a pad forming portion, is attached to said carriage and where the other end of said head wire is connected to said pad forming portion;

said pad forming portion being provided on one end portion of a patterned surface of said FPC cable and said device mounting portion being provided on a portion of said patterned surface adjacent to said pad forming portion; and said head-side end portion being formed by folding back said pad forming portion so that a rear surface of said patterned surface is located inside.

13. A disk drive comprising:

a disk which is a data storage medium;

a carriage unit fitted on a rotational shaft so as to be freely rotatable, the rotational shaft being fixedly arranged and said carriage unit being movable along a surface of said disk; and a motor for driving said carriage unit;

wherein said carriage unit comprises:

a carriage having a plurality of head arms protruded in the form of a comb;

heads mounted on said head arms, one end of each of head wires being connected to each head; and an FPC cable where its head-side end portion, including a device mounting portion having an electronic device mounted thereon and a pad forming portion, is attached to said carriage and where the other end of said head wire is connected to said pad forming portion;

said pad forming portion and said device mounting portion being provided on one end portion of said FPC cable;

said FPC cable being equipped with a spacer having a flat plate portion, a device protecting surface of the flat plate portion being formed with a cavity for storing said electronic device; and said head-side end portion being constituted by engaging said spacer with a main body of said FPC cable so that said electronic device is stored in said cavity and that said device protecting surface is in close proximity to said device mounting portion.

* * * * *